United States Patent [19]

Kazama

[11] Patent Number: 5,414,369

[45] Date of Patent: May 9, 1995

[54] COIL SPRING-PRESSED NEEDLE CONTACT PROBE MODULES WITH OFFSET NEEDLES

[75] Inventor: Toshio Kazama, Nagano, Japan

[73] Assignee: NHK Spring Co., Ltd., Japan

[21] Appl. No.: 148,488

[22] Filed: Nov. 8, 1993

[30] Foreign Application Priority Data

Nov. 9, 1992 [JP] Japan .................. 4-323574

[51] Int. Cl.⁶ .............................................. G01R 1/04
[52] U.S. Cl. .................................................... 324/758
[58] Field of Search ............. 324/158 F, 158 P, 158 R, 324/756–758; 439/66, 86

[56] References Cited

U.S. PATENT DOCUMENTS

| | | | |
|---|---|---|---|
| 4,528,500 | 7/1985 | Lightbody et al. | 324/73 PC |
| 4,535,536 | 8/1985 | Wyss | 29/845 |
| 4,544,888 | 10/1985 | Kvaternik | 324/158 |
| 4,633,176 | 12/1986 | Reimer | 324/158 |
| 4,686,467 | 8/1987 | DeLapp et al. | 324/158 |
| 4,896,107 | 1/1990 | Maelzer et al. | 324/158 |
| 4,931,726 | 6/1990 | Kasukabe et al. | 324/158 F |
| 5,003,255 | 3/1991 | Kazama | 324/158 P |
| 5,004,977 | 4/1991 | Kazama | 324/158 P |
| 5,084,673 | 1/1992 | Kazama | 324/158 P |
| 5,092,774 | 3/1992 | Milan | 324/158 F |
| 5,189,364 | 2/1993 | Kazama | 324/158 P |
| 5,200,695 | 4/1993 | Kazama | 324/158 P |

FOREIGN PATENT DOCUMENTS 60-154868 10/1985 Japan ........................... G01R 1/067

Primary Examiner—Kenneth A. Wieder
Assistant Examiner—Barry C. Bowser
Attorney, Agent, or Firm—Skjerven, Morrill, MacPherson, Franklin, & Friel

[57] ABSTRACT

In a contact probe having a pair of needle members elastically projecting from two ends thereof for temporarily connecting two points by contacting them with the two needle members, a coil spring interposed between the needle member consists of material having a low electric resistance, and is securely connected to the rear ends of the associated needle members at its two ends by soldering, brazing, welding, or wire-wrapping to establish an electroconductive path between the two needle members. Thus, the two needle members are substantially directly connected with each other via the compression coil spring serving as an electric conductor, and the electric resistance between them can be kept low and stable. The elimination of a separate conductor to be connected between the two needle members allows the diameter and the length of the contact probe to be reduced. The same goal can be achieved by forming at least one of the needle members with an extension of an associated end of the coil spring, with the added advantage of simplicity. Each contact probe module is confined within a four layered insulative holder having offset bores such that needle members protruding from one holder surface are at a different lateral spacing and hence density than the needles protruding from a second parallel holder surface.

9 Claims, 6 Drawing Sheets

COIL SPRING-PRESSED NEEDLE CONTACT PROBE MODULES WITH OFFSET NEEDLES

CROSS REFERENCE TO RELATED PATENTS AND CO-PENDING APPLICATIONS

The following patents and co-pending patent applications are directed to subject matters similar to those of the present application, and are commonly assigned to NHK Spring Co., Ltd. The contents of these applications are hereby incorporated in the present application by reference.

| Application Number | Filing Date | Remarks |
| --- | --- | --- |
| 08/148,489 | filed 11/08/93 | |
| 08/013,465 | February 4, 1993 | Attorney's docket Number: A-333 |
| 07/739,051 | July 30, 1991 | U.S. Pat. No. 5,200,695 issued April 6, 1993 |
| 07/737,763 | July 30, 1991 | U.S. Pat. No. 5,189,364 issued February 23, 1993 |
| 07/600,198 | October 19, 1990 | Div. of 07/536,516 U.S. Pat. No. 5,084,673 issued March 26, 1991 |
| 07/536,516 | October 19, 1990 | U.S. Pat. No. 5,003,255 issued March 26, 1991 |
| 07/424,511 | October 20, 1989 | U.S. Pat. No. 5,004,977 issued April 2, 1991 |

TECHNICAL FIELD

The present invention relates to a contact probe for electrically accessing various parts of printed circuit boards, semiconductor devices and other electric and electronic components, and in particular to a contact probe provided with a pair of accessing points at axially opposite ends thereof.

BACKGROUND OF THE INVENTION

Conventionally, the contact probe used in contact probe assemblies for electrically testing electroconductive patterns of printed circuit boards and electronic components in general comprises an electroconductive needle member, a tubular holder slidably receiving the needle member, and a coil spring for urging the forward end of the needle member out of the tubular holder so that the forward end of the needle member may be brought into contact with an object to be tested with a certain elastic force pushing the needle member against this object.

As a type of such a contact probe, there are known those employing a pair of needle members which are received in two ends of a tubular holder and elastically urged by a compression coil spring away from each other. One such contact probe is disclosed in Japanese utility model laid-open (kokai) publication No. 60-154868. A contact probe of this type having two moveable accessing ends is typically employed for temporarily connecting the circuits of two circuit boards, which are to be ultimately connected with each other during one of the subsequent fabrication steps, for testing purpose. According to this structure, the electric connection between the two accessing ends is accomplished by a central conductor wire directly connected between the two needle members, for instance by soldering or brazing, the electric resistance between the two accessing ends may be kept both low and stable.

However, according to this structure, the central conductor wire is required to flex, bend or otherwise deform as the two needle members move toward and away from each other. Therefore, when the tubular holder is required to have a very small diameter, typically to the end of densely arranging a number of contact probes in a limited area of a contact probe assembly, the tubular holder is required to be long enough to accommodate flexing or slackening of the central conductor wire, and this is detrimental to the compact design of the contact probe assembly.

BRIEF SUMMARY OF THE INVENTION

In view of such problems of the prior art, a primary object of the present invention is to provide a contact probe having two moveable accessing ends which is electrically stable and suitable for compact design.

A second object of the present invention is to provide a contact probe having two moveable accessing ends which offers a very small electric resistance between the two accessing ends, and is durable in use.

A third object of the present invention is to provide a contact probe having two moveable accessing ends which is simple and economical to manufacture.

A fourth object of the present invention is to provide a contact probe assembly including a plurality of densely arranged contact probes which can readily adapt itself to various applications.

These and other objects of the present invention can be accomplished by providing a contact probe, comprising: a first electroconductive needle member having a forward end and a rear end; a second electroconductive needle member having a forward end and a rear end; a holder having a bore for slidably receiving the needle members therein with the rear ends thereof opposing each other; a coil spring interposed between the rear ends of the needle members and received in the holder, for urging the needle members so as to elastically project the forward end of each of the needle members from a corresponding end of the holder, the coil spring consisting of material having a low electric resistance; and means for securely connecting two ends of the coil spring to the rear ends of the associated needle members such as a soldered, brazed, welded, or wire-wrapped part between the needle member and the coil spring to establish an electroconductive path between the two needle members typically the coil spring serving as a sole means of establishing an electric connection between the two needle members.

Thus, the two needle members are substantially directly connected with each other via the compression coil spring serving as an electric conductor, and the electric resistance between them can be kept low and stable. The elimination of a separate conductor to be connected between the two needle members allows the diameter and the length of the contact probe to be reduced. The same goal can be achieved by forming at least one of the needle members with an extension of an associated end of the coil spring, with the added advantage of simplicity.

According to a preferred embodiment of the present invention, the holder comprises a primary insulator member having a through hole for receiving the needle members and the coil spring therein, a secondary insulator member having a first opening coaxially aligned with an end of the through hole, and allowing the forward end of the first needle member to project therefrom, and a tertiary insulator member having a second opening coaxially aligned with another end of the through hole opposite from the one end, and allowing the forward end of the second needle member to project therefrom; an inner diameter of each of the first and second openings being large enough to allow the forward end of the corresponding needle member to project therefrom but small enough to prevent passage of the rear end of the corresponding needle member.

If the middle insulator consists of a plurality of layers of middle insulators, the forming of the through holes in the middle insulators for passing the contact probes is simplified, and if necessary, it is possible to accommodate some misalignment between the upper and lower needle members.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
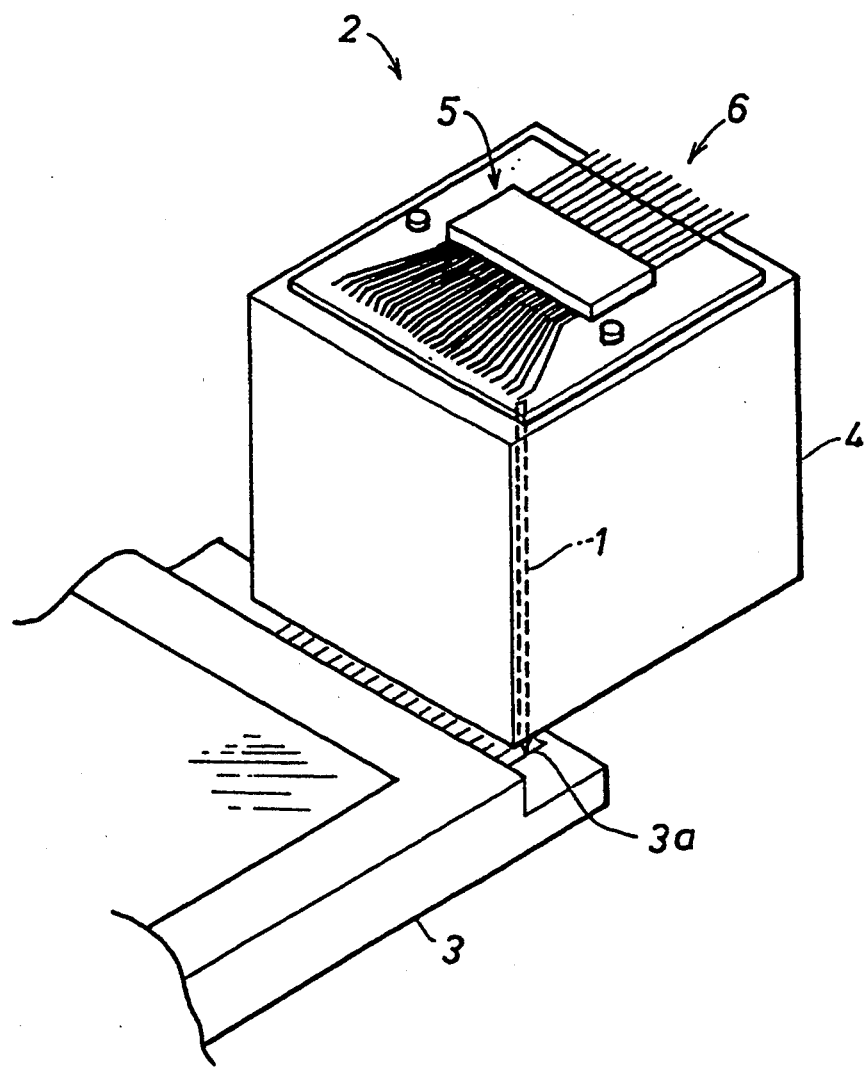
FIG. 1 is a perspective view showing a manner in which a contact probe assembly using a multiplicity of contact probes according to the present invention is used.

FIG. 1 shows the manner in which a contact probe assembly 2 using a plurality of contact probes 1 having two accessing ends according to the present invention may be used. In this embodiment, the contact probe assembly 2 is used for testing an LCD panel 3 before finally connecting a TAB or a LSI for driving the LCD panel during the fabrication process.

As shown in FIG. 1, a TAB 5 for testing purpose is mounted on a main body block 4 of the contact probe assembly 2. The main body block 4 incorporates at least a same number of contact probes 1 as the terminals of the lead pattern 3a of the LCD panel 3 for temporarily connecting them to the associated terminals of the TAB 5. In FIG. 1, only one contact probe 1 is shown in dotted lines for the convenience of illustration. The upper ends of the contact probes 1 are in contact with the terminals of the TAB 5 while the remaining terminals 6 of the TAB 5 are connected to external circuits so that necessary power and signals may be supplied to the TAB 5 for its functioning.

When a test is to be carried out, the main body block 4 is lowered until the lower ends of the contact probes 1 projecting downward from the main body block 4 are brought into contact with the associated terminals of the lead pattern 3a of the LCD panel 3, and control signals are supplied to the TAB 5 via the terminals 6, and the LCD panel 3 are appropriately operated. Typically, the operator of the testing system visually determines the acceptability of the LCD panel 3 from the test display thereon generated by the testing system.

Figure 2:
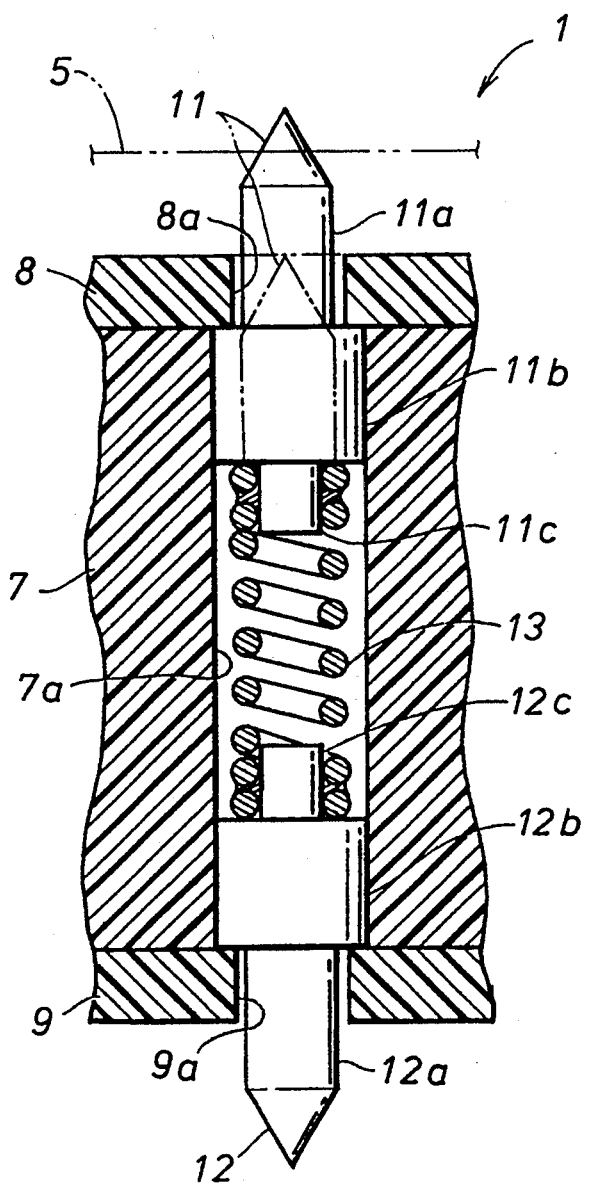
FIGS. 2 through 5 are vertical sectional views showing different embodiments of the contact probe according to the present invention.

The structure of the contact probe 1 is now described in the following with reference to FIG. 2. The main body block 4 or the contact probe assembly comprises a middle insulator 7 consisting of a plate or block member having a relatively large thickness, and upper and lower insulators 8 and 9 laminated over the upper and lower surfaces of the middle insulator 7, respectively, each having a thickness substantially smaller than that of the middle insulator 7. More specifically, the middle insulator 7 is provided with a through hole 7a for each contact probe 1, and the upper and lower insulators 8 and 9 are provided with openings 8a and 9a, respectively, which are coaxially disposed to the through hole 7a and slightly smaller in diameter than the through hole 7a.

This contact probe 1 is provided with two accessing ends as mentioned before, and, accordingly, comprises upper and lower needle members 11 and 12. The upper and lower needle members 11 and 12 each consist of a forward end portion 11a or 12a, a middle portion 12b or 13b, and a rear end portion 11c or 12c. These parts are all provided with a circular cross section, and are disposed in mutually coaxial relationship. The openings 8a and 9a are large enough to allow passage of the forward end portions 11a and 12a, respectively, but are small enough to engage the large diameter portions 11b and 12b, respectively. The rear end portions 11c and 12c are substantially smaller in diameter than the large diameter middle portions 11b and 12b.

A compression coil spring 13 is coaxially interposed between the two needle members 11 and 12. More specifically, each end of the compression coil spring 13 is supported by an annular shoulder surface defined between the corresponding middle 11b or 12b and the corresponding rear end portion 11c or 12c. As shown in FIG. 2, each of the rear end portions 11c and 12c of the needle members 11 and 12 are fitted into the associated ends of the compression coil spring 13, and are soldered thereto. Instead of soldering, other means may be employed. For instance, they may be brazed or welded together. Alternatively, the coil wire of the corresponding ends of the coil spring 13 may be tightly wrapped around the rear ends 11c and 12c with a certain tension maintained in the coil wire before and after this wrapping process so that an extremely secure electric connection may be established therebetween.

The insulators 7 through 9 are joined together by fasteners such as threaded screws not shown in the drawing. Additionally, the TAB 5 is mounted on the upper surface of the main body block 4 as indicated by the imaginary lines in FIG. 2. In FIG. 2, it is also shown by the imaginary lines that the needle member 11 may be pushed into the through hole 7a, and thereby elastically urged onto the corresponding terminal of the TAB 5 as a result of the compression of the compression coil spring 13.

According to this embodiment, because the receptacle for each of the contact probes is formed by the insulator assembly itself without using any tubular member for receiving each of the needle members, the contact probes may be more closely arranged in the contact probe assembly, and, for a given density of contact probes in the contact probe assembly, the mechanical strength of the needle members and the spring force of the coil spring may be both increased. In other words, for the given mechanical strength of the needle members and spring force of the compression coil spring, the distribution density of the contact probes can be increased because the outer diameter of each of the contact probes can be reduced.

In the drawings, the radial or horizontal dimensions are significantly exaggerated as compared to the longitudinal or vertical dimensions for the convenience of illustration. In reality, the contact probe is longer and thinner than illustrated. For instance, the typical outer diameters of the forward end portions 11a and 12a and the middle portions 11b and 12b are 0.20 mm and 0.27 mm, respectively, while the thickness of the insulator assembly 6 through 8 is 11 mm.

According to this embodiment, the two ends of the compression coil spring 13 are soldered, brazed or otherwise securely connected to the rear end portions 11c and 12c, and the electric resistance between the two needle members 11 and 12 is minimized and kept stable throughout its operation. Furthermore, as compared to the conventional structure, the overall length of the contact probe can be minimized, or the overall height of the main body block 4 can be minimized. By reducing the distance of the electric conductive paths between the LCD panel 3 and the TAB 5, degradation of signals can be minimized, and the testing process can be accordingly accurately carried out. Furthermore, because the TAB 5 can be mounted on an exposed and readily accessible part of the main body block 4 owing to the increased compactness of the main body block 4, replacing the TAB 5 in case of a failure is also simplified.

Figure 3:
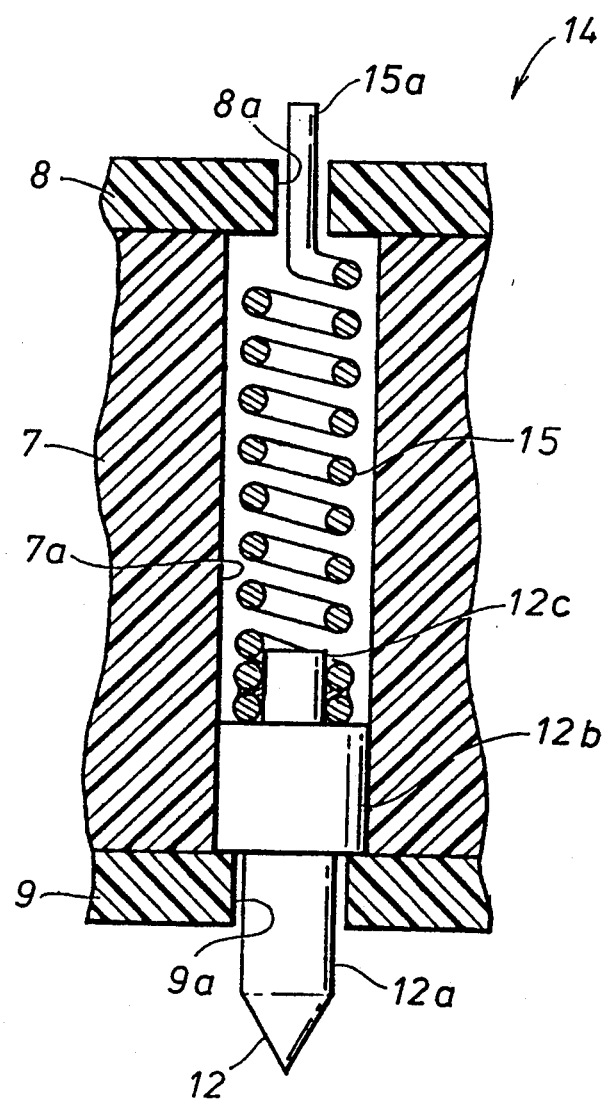

FIG. 3 shows a second embodiment of the present invention. In FIG. 3, the parts corresponding to those of the previous embodiment are denoted with like numerals. In this contact probe 14, the structure of the insulator assembly 6 through 8 is not different from that of the first embodiment. In this contact probe 14, a single needle member 12 projects from the opening 9a of the lower insulator 9, and a compression coil spring 15 interposed between the needle member 12 and the upper insulator 8 urges this needle member 12 downward in the same way as the coil spring 13 of the first embodiment. The coil wire at the end 15a of the coil spring 15 remote from the needle member 12 is passed through the opening 8a provided in the upper insulator 8. The end of the coil spring adjoining the needle member 12 is soldered to the rear end portion 12c of the needle member 12.

This contact probe 14 operates substantially in the same way as the first embodiment, and offers similar advantages, but is simpler in structure due to the absence of the upper or the second needle member.

Figure 4:
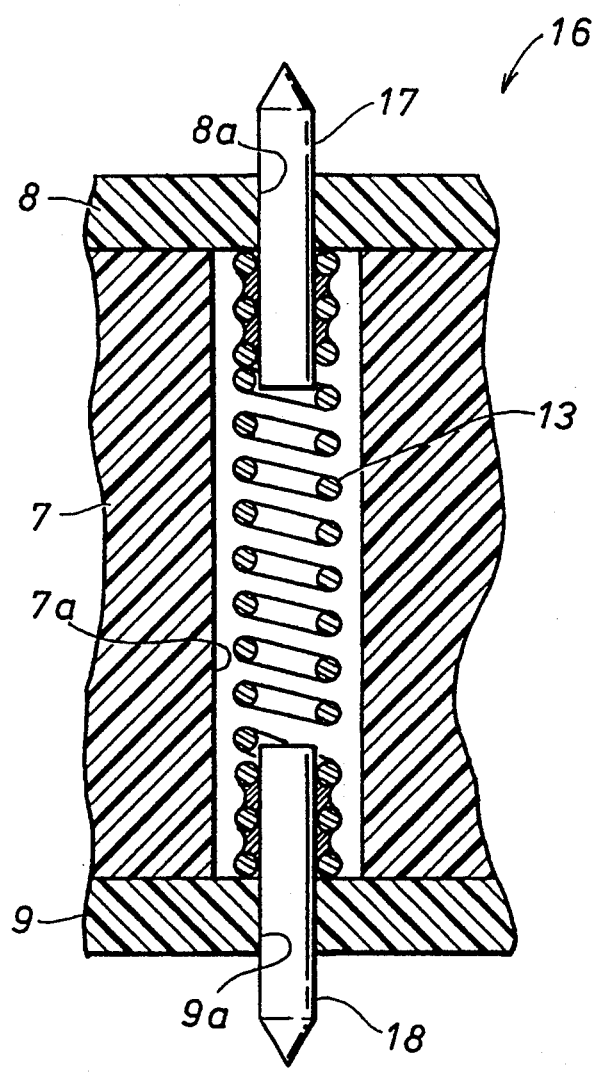

FIG. 4 shows a third embodiment of the present invention. In FIG. 4, the parts corresponding to those of the previous embodiments are denoted with like numerals. In this contact probe 16, the structure of the insulator assembly 6 through 8 is also not different from that of the first embodiment. In this contact probe 16, upper and lower needle members 17 and 18 similar to the upper and lower needle members 11 and 12 of the first embodiment each consist of a straight needle member 17 or 18 which has a uniform circular cross section except that its forward end is sharply pointed. The two ends of the compression coil spring 13 are wrapped around the base ends of the corresponding needle members 17 and 18, and are soldered thereto. The thus soldered ends of the compression coil spring 13 serve as means for defining the extent to which the needle members 17 and 18 can project from the openings 8a and 9a of the upper and lower insulators 8 and 9 as well as means for engaging the two ends of the compression coil spring 13 to the corresponding needle members 17 and 18.

This embodiment operates in a similar fashion as the first and second embodiments, and may be used for temporarily connecting two circuits placed one over the other for measuring and testing purposes. According to this embodiment, each of the needle members may be made of a straight wire member, and the fabrication of the needle members is simplified.

Figure 5:
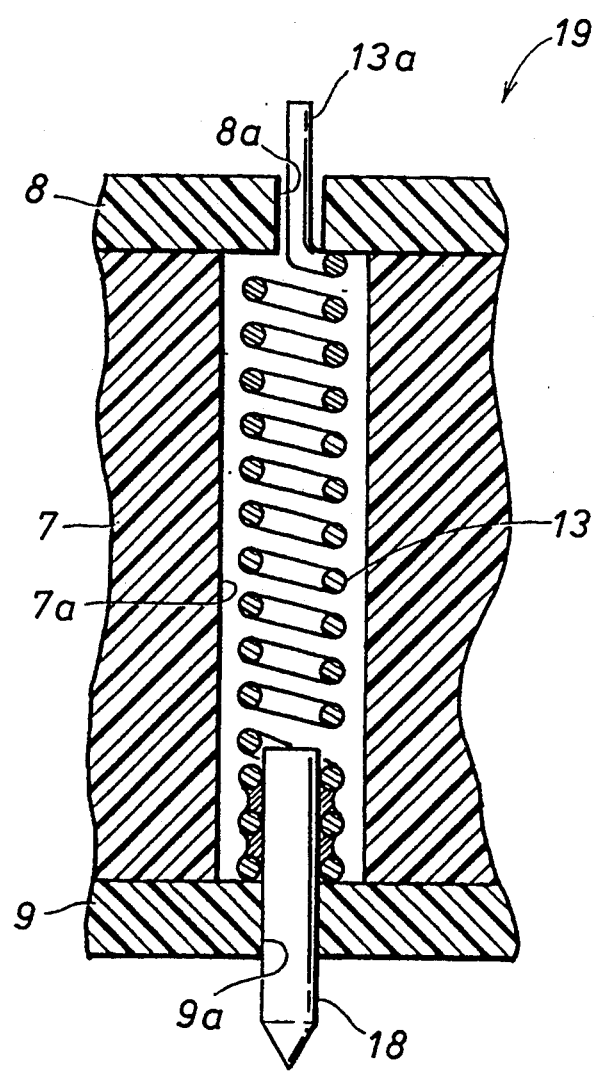

FIG. 5 shows a fourth embodiment of the present invention. In FIG. 5, the parts corresponding to those of the previous embodiments are denoted with like numerals. In this contact probe 19, the structure of the insulator assembly 6 through 8 is also not different from that of the first embodiment. This contact probe 19 is similar to the contact probe of the second embodiment illustrated in FIG. 3, but the needle member 18 projecting from the opening 9a of the lower insulator 9 consists of a straight wire member in the same way as the needle members 17 and 18 of the third embodiment illustrated in FIG. 4.

This embodiment operates in a similar fashion as the previous embodiments, and may be used for temporarily connecting two circuits placed one over the other for measuring and testing purposes. According to this embodiment, only one needle member is required, and it may be made of a straight wire member. Thus, the fabrication of the contact probe is extremely simplified. It is also possible to entirely eliminate the separate needle members, and employ the two ends of the compression coil spring as the needle members.

Figure 6:
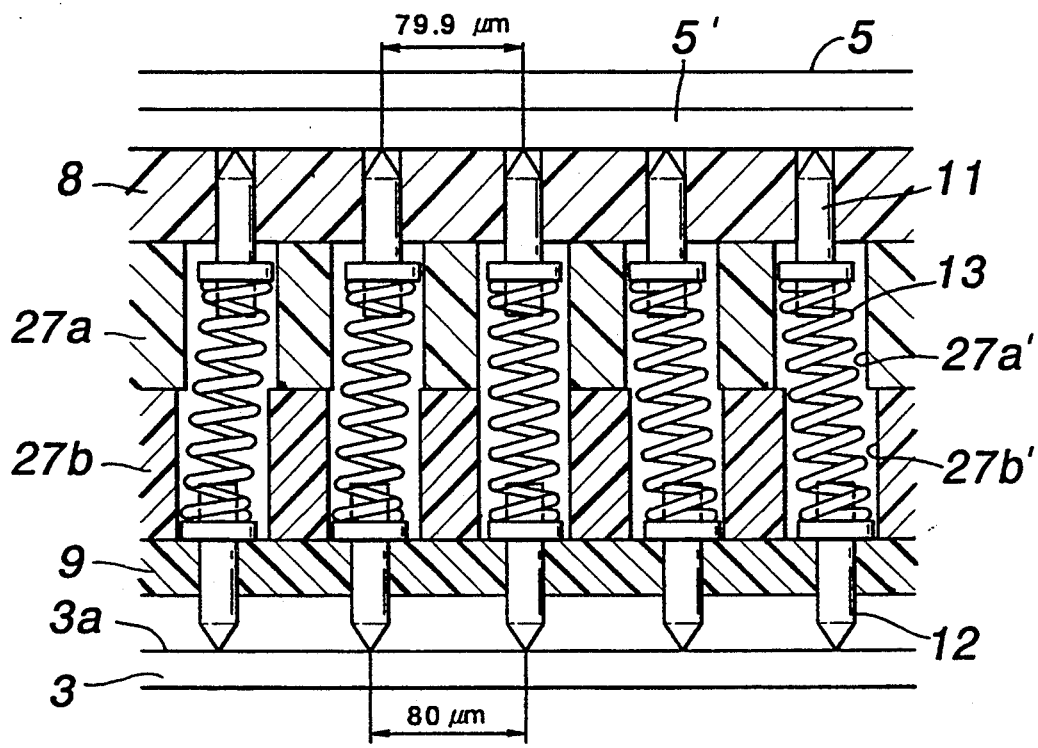
FIG. 6 is a sectional view of an embodiment of the contact probe assembly according to the present invention.

FIG. 6 shows a part of a contact probe assembly including a plurality of contact probes each of which may consist of any one of the above described contact probes. The contact probes used in this particular assembly are substantially identical to the one illustrated in FIG. 2, and each comprises an upper needle member 11, a lower needle member 12, and a compression coil spring 13 interposed between the upper and lower needle members 11 and 12. Similarly, the upper and lower needle members 11 and 12 are allowed to project upward and downward, respectively, from upper and lower insulators 8 and 9 of the insulator assembly by a certain prescribed extent defined by the abutment of the large diameter portion of each of the needle members with the periphery of the associated opening of the associated insulator.

In this case, the pitch of the upper needle members 11 is slightly smaller than that of the lower needle member 12. The difference in the pitch may be so small that it may be insignificant where there are only a small number of contact probes, but the cumulative deviation in alignment becomes significant as the number of the contact probes in each array is increased. Therefore, even though the difference in the pitch may be small, some measure must be taken to accommodate the difference in the pitch.

In this embodiment, the middle insulator consists of two layers of middle insulators 27a and 27b. In FIG. 6, the needle members 11 and 12 of the contact probe in the middle are exactly aligned with each other, but those on either side of the middle contact probe are offset from each other. This offset is 0.01 $\mu$m for the one next to the middle one, 0.02 $\mu$m for the one next but one to the middle one, and so on.

To account for such an offset, the holes 27a' and 27b' provided in the middle insulators 27a and 27b are offset from each other in the same way as the upper and lower needle members are offset from each other.

Thus, according to this contact probe assembly, it is possible to readily accommodate any slight offsetting in the upper and lower arrays of points to be accessed (in this case, consisting of leads 5' of a TAB 5 and leads 3a of an LCD panel 3) by offsetting the through holes 27a' and 27b' of the middle insulators 27a and 27b as well as the needle members accordingly.

Such offsetting of arrays of points to be accessed occurs, for instance, when one of the arrays of points to be accessed undergoes a thermal expansion or contraction when the parts associated with the two arrays of points to be accessed are assembled together by soldering, thermal adhesion and other processes involving heat, and some offsetting is present at the time of testing preceding the assembling process. The offsetting is eliminated when the two parts are finally joined together.

Furthermore, even in the absence of such offsetting, forming the middle insulator with two or more of layers of middle insulators is advantageous because the need for forming a large number of long and fine bores for passing the contact probes can be eliminated because the holes in each layer of the middle insulators have a limited length, and can therefore be formed with high precision without any undue difficulty.

According to the present invention, the needle members and the compression coil spring are joined together by soldering, brazing, welding, or wire-wrapping, or an end of the coil wire of the compression coil spring is employed as a needle member. Therefore, the electric resistance between the two accessing ends of the contact probe can be minimized, and can be made stable in the sense that the resistance stays constant irrespective of the movement of the needle member. When at least one end of the coil wire of the compression coil spring is employed as a needle member, the overall structure can be extremely simplified.

If the middle insulator consists of a plurality of layers of middle insulators, the forming of the holes in the middle insulators for passing the contact probes is simplified, and if necessary, it is possible to accommodate some misalignment between the upper and lower needle members.

Although the present invention has been described in terms of specific embodiments thereof, it is possible to modify and alter details thereof without departing from the spirit of the present invention.

What we claim is:

1. A contact probe assembly, comprising a plurality of contact probe modules, each module comprising:
    a first electroconductive needle member having a forward end and a rear end;
    a second electroconductive needle member having a forward end and rear end;
    an electrically insulative holder having bores for slidably receiving said needle members therein with said rear ends thereof opposing each other;
    a coil spring interposed between said rear ends of said needle members and received in said holder bores, for urging said needle members so as to elastically project said forward end of each of said needle members from a corresponding end of said holder bores;
    said holder comprising a plurality of layers of primary insulator members each having through hole for receiving said coil spring therein, a secondary insulator member, placed over a first external surface of said primary insulator members, and having a first opening for allowing said forward end of said first needle member to protect therefrom, and a tertiary insulator member placed over a second external surface of said primary insulator members, and having a second opening for allowing said forward end of said second needle member to project therefrom;
    an inner diameter of each of said first and second openings being large enough to allow said forward end of said corresponding needle member to project therefrom but small enough to prevent passage of said rear end of said corresponding needle member,
    said through holes and said openings defining said bores;
    at least one of said bores being offset from at least between two adjacent ones of said through holes of said primary insulator members, said first opening of said secondary insulator member, and said second opening of said tertiary insulator member; and
    wherein the density of the arrangement of said first needle members is greater than the density of the arrangement of said second needle members.

2. A contact probe assembly according to claim 1, further comprising means for securely connecting two ends of said coil spring to said rear ends of said associated needle members to establish an electric conductive path between said two needle members, said coil spring consisting of material having a low electric resistance.

3. A contact probe assembly according to claim 2, wherein said connecting means consists of a soldered, brazed, welded, or wire-wrapped part between said needle member and said coil spring.

4. A contact probe assembly according to claim 1, wherein at least one of said first and second needle members consists of an extension of an associated end of said coil spring.

5. A contact probe assembly according to claim 1 wherein said coil spring is the sole electrical conductive path between said first and second needle members.

6. A contact probe assembly according to claim 1, wherein said rear end of at least one of said needle members includes a large diameter portion defining a shoulder surface which abuts a periphery of the opening of an associated one of said second and third insulator members.

7. A contact probe assembly according to claim 6, wherein said rear end of said needle member comprises a projection coaxially projecting from an end of said large diameter portion remote from said forward end, thereby defining an annular shoulder surface between said projection and said large diameter portion for engaging an associated end of said coil spring, and a part of said associated end of said coil spring is soldered, brazed, welded or wire-wrapped to said projection.

8. A contact probe assembly according to claim 1, wherein at least one of said needle members consists of a wire member having a substantially uniform cross section except for an extreme forward end thereof, and an associated end of said coil spring is wrapped around said rear end of the associated needle member, and is soldered, brazed, welded or wire-wrapped to said projection so as to define a shoulder surface which abuts a periphery of the opening of an associated one of said second and third insulator members.

9. A contact probe assembly, comprising a plurality of contact probes, and an electrically insulative holder having a plurality of substantially parallel bores for receiving said contact probes:
    each of said contact probes comprising: a first electroconductive needle member having a forward end and a rear end received in an associated one of said bores with said forward end extending out said associated one of said bores; a second electroconductive needle member having a forward end and a rear end received in a second associated one of said bores with said rear end thereof opposing said rear end of said first electroconductive needle member and said forward end of said second electroconductive needle member extending out of said second associated one of said bores; a coil spring interposed between said rear ends of said needle members and received in said associated bores, for urging said needle members so as to elastically project said forward end of each of said needle members from a corresponding end of said associated bores, said coil spring consisting of material having a low electric resistance; means for securely connecting two ends of said coil spring to said rear ends of said associated needle members to establish an electric conductive path between said two needle members;

said holder comprising: a plurality of layered primary insulator members each having through holes defining a part of said associated bores; a secondary insulator member, placed over a first external surface of said primary insulator members, and having first openings associated with said through holes for allowing said forward end of said first needle members to project therefrom; and a tertiary insulator member, placed over a second external surface of said primary insulator members, and having second openings associated with said through holes for allowing said forward end of said second needle members to project therefrom; an inner diameter of each of said first and second openings being large enough to allow said forward end of said corresponding needle member to project therefrom but small enough to prevent passage of said rear end of said corresponding needle member;

at least one of said bores being offset from at least two adjacent ones of said through holes of said primary insulator members, said first opening of said secondary insulator member, and said second opening of said tertiary insulator member; and wherein the density of the arrangement of said first needle members is greater than the density of the arrangement of said second needle members.

* * * * *